US012690463B2

(12) United States Patent
    Yim et al.

(10) Patent No.:    US 12,690,463 B2
(45) Date of Patent:          Jul. 21, 2026

(54) SEMICONDUCTOR PACKAGE

(71) Applicant: SAMSUNG ELECTRONICS CO., LTD., Suwon-si (KR)

(72) Inventors: Choongbin Yim, Suwon-si (KR); Hyonchol Kim, Suwon-si (KR); Sungbum Kim, Suwon-si (KR); Gitae Park, Suwon-si (KR); Jiyong Park, Suwon-si (KR); Jinwoo Park, Suwon-si (KR); Jongbo Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 719 days.

(21) Appl. No.: 18/113,910

(22) Filed: Feb. 24, 2023

(65) Prior Publication Data

US 2023/0361051 A1      Nov. 9, 2023

(30) Foreign Application Priority Data

May 9, 2022    (KR) ........................ 10-2022-0056779

(51) Int. Cl.
    *H10W 42/00*          (2026.01)
    *H10W 70/685*          (2026.01)
              (Continued)

(52) U.S. Cl.
    CPC ....... *H10W 42/121* (2026.01); *H10W 70/685* (2026.01); *H10W 74/117* (2026.01);
              (Continued)

(58) Field of Classification Search
    None
    See application file for complete search history.

(56) References Cited

U.S. PATENT DOCUMENTS

| 10,178,768 B2 | 1/2019 | Matsuura et al. |
| 10,879,158 B2 | 12/2020 | Patil et al. |

(Continued)

FOREIGN PATENT DOCUMENTS

| JP | 2010-212318 | 9/2010 |
| JP | 6476871 | 3/2019 |

(Continued)

OTHER PUBLICATIONS

Office Action dated Oct. 10, 2025 issued in corresponding to Korean Patent Application No. 10-2022-0056779.

*Primary Examiner* — Nicholas J Tobergte
(74) *Attorney, Agent, or Firm* — Morgan, Lewis & Bockius LLP

(57)          ABSTRACT

A semiconductor package includes: a package substrate including a redistribution layer, a lower protective layer, and a plurality of support protrusions, wherein the redistribution layer has first and second pads disposed on the package substrate, wherein the lower protective layer has first openings and a trench, wherein the trench exposes the second pads, and wherein the plurality of support protrusions are disposed in the trench; a semiconductor chip disposed on the package substrate and including connection pads electrically connected to the redistribution layer; an encapsulant disposed on at least a portion of the semiconductor chip; first connection bumps electrically connected to the first pads, respectively; a passive device disposed in the trench of the lower protective layer and electrically connected to the second pads; and a sealant covering at least a portion of the passive device and extending into the trench.

20 Claims, 10 Drawing Sheets

1000

(51) Int. Cl.

| | |
|---|---|
| *H10W 74/10* | (2026.01) |
| *H10W 90/00* | (2026.01) |
| *H10W 70/05* | (2026.01) |
| *H10W 72/00* | (2026.01) |
| *H10W 90/24* | (2026.01) |

(52) U.S. Cl.

CPC ......... *H10W 90/00* (2026.01); *H10W 90/701* (2026.01); *H10W 70/093* (2026.01); *H10W 72/07236* (2026.01); *H10W 90/24* (2026.01); *H10W 90/722* (2026.01); *H10W 90/724* (2026.01); *H10W 90/752* (2026.01); *H10W 90/754* (2026.01)

(56) References Cited

U.S. PATENT DOCUMENTS

| | | | |
|---|---|---|---|
| 10,950,686 B2 | 3/2021 | Karashima | |
| 2013/0127062 A1 | 5/2013 | Haba et al. | |
| 2013/0161784 A1 | 6/2013 | Jang et al. | |
| 2014/0160688 A1* | 6/2014 | Lu ........................... | H05K 1/181 |
| | | | 361/728 |
| 2018/0138155 A1* | 5/2018 | Kim ....................... | H01L 23/552 |
| 2020/0006179 A1* | 1/2020 | Chen ................... | H01L 23/5226 |
| 2021/0074600 A1* | 3/2021 | Jeng ....................... | H01L 21/486 |

FOREIGN PATENT DOCUMENTS

| | | |
|---|---|---|
| KR | 10-1524490 | 6/2015 |
| KR | 10-2021-0096381 A | 8/2021 |

* cited by examiner

SEMICONDUCTOR PACKAGE

CROSS-REFERENCE TO RELATED APPLICATION

This application claims benefit of priority under 35 U.S.C. 119(a) to Korean Patent Application No. 10-2022-0056779 filed on May 9, 2022 in the Korean Intellectual Property Office, the disclosure of which is incorporated by reference herein in its entirety.

TECHNICAL FIELD

Example embodiments of the present inventive concept relate to a semiconductor package. More particularly, the present inventive concept relates to a semiconductor package including a package substrate including a trench.

DISCUSSION OF THE RELATED ART

In the case of a semiconductor package in which a high-performance semiconductor chip is embedded or mounted, issues such as malfunctioning and performance degradation of a system may occur due to voltage noise being generated in a high-frequency band. Accordingly, it may be desirable to develop a packaging technique for improving power integrity (P1) properties of a semiconductor package by removing voltage noise. To this end, generally, a passive device may be mounted on a rear surface of a semiconductor package.

SUMMARY

An example embodiment of the present inventive concept provides a semiconductor package having increased reliability.

According to an example embodiment of the present inventive concept, a semiconductor package includes: a package substrate having upper and lower surfaces opposing each other, and including a redistribution layer, a lower protective layer, and a plurality of support protrusions, wherein the redistribution layer has first and second pads disposed on the lower surface of the package substrate, wherein the lower protective layer has first openings and a trench, wherein the first openings expose at least a portion of each of the first pads, wherein the trench exposes the second pads, and wherein the plurality of support protrusions are disposed in the trench; a semiconductor chip disposed on the upper surface of the package substrate and including connection pads electrically connected to the redistribution layer; an encapsulant disposed on at least a portion of the semiconductor chip; first connection bumps disposed in the first openings of the lower protective layer, respectively, and electrically connected to the first pads, respectively; a passive device disposed in the trench of the lower protective layer and electrically connected to the second pads; and a sealant covering at least a portion of the passive device and extending into the trench.

According to an example embodiment of the present inventive concept, a semiconductor package includes: a package substrate having upper and lower surfaces opposing each other, and including a redistribution layer, a lower protective layer, and a plurality of support protrusions, wherein the redistribution layer includes pads disposed on the lower surface, wherein the lower protective layer has a trench exposing the pads, and wherein the plurality of support protrusions are disposed in the trench; a semiconductor chip disposed on the upper surface of the package substrate and electrically connected to the redistribution layer; an encapsulant covering at least a portion of the semiconductor chip; a passive device disposed in the trench of the lower protective layer and including connection terminals facing the lower surface; bump structures connecting the connection terminals of the passive device to the pads of the redistribution layer, respectively; and a sealant extending into the trench and at least partially surrounding the plurality of support protrusions and the bump structures.

According to an example embodiment of the present inventive concept, a semiconductor package includes: a package substrate having upper and lower surfaces opposing each other and including a redistribution layer, a lower protective layer, and a plurality of support protrusions, wherein the redistribution layer includes pads disposed on the lower surface, wherein the lower protective layer has a trench exposing the pads, and wherein the plurality of support protrusions are disposed in the trench; a semiconductor chip disposed on the upper surface of the package substrate and electrically connected to the redistribution layer; a passive device disposed in the trench of the lower protective layer and electrically connected to the pads; and a sealant covering at least a portion of the passive device and disposed in the trench, wherein the plurality of support protrusions include at least one first support protrusion and at least one second support protrusion, wherein the at least one first support protrusion overlaps the passive device in a direction substantially perpendicular to the lower surface of the package substrate, and the at least one second support protrusion does not overlap the passive device.

BRIEF DESCRIPTION OF DRAWINGS

The above and other aspects of the present inventive concept will become more apparent by describing in detail embodiments thereof, with reference to the accompanying drawings, in which:

FIG. 5A is an enlarged diagram illustrating a portion of a region of a semiconductor package according to an example embodiment of the present inventive concept;

DETAILED DESCRIPTION OF THE EMBODIMENTS

Hereinafter, example embodiments of the present inventive concept will be described as follows with reference to the accompanying drawings.

Figure 1A:
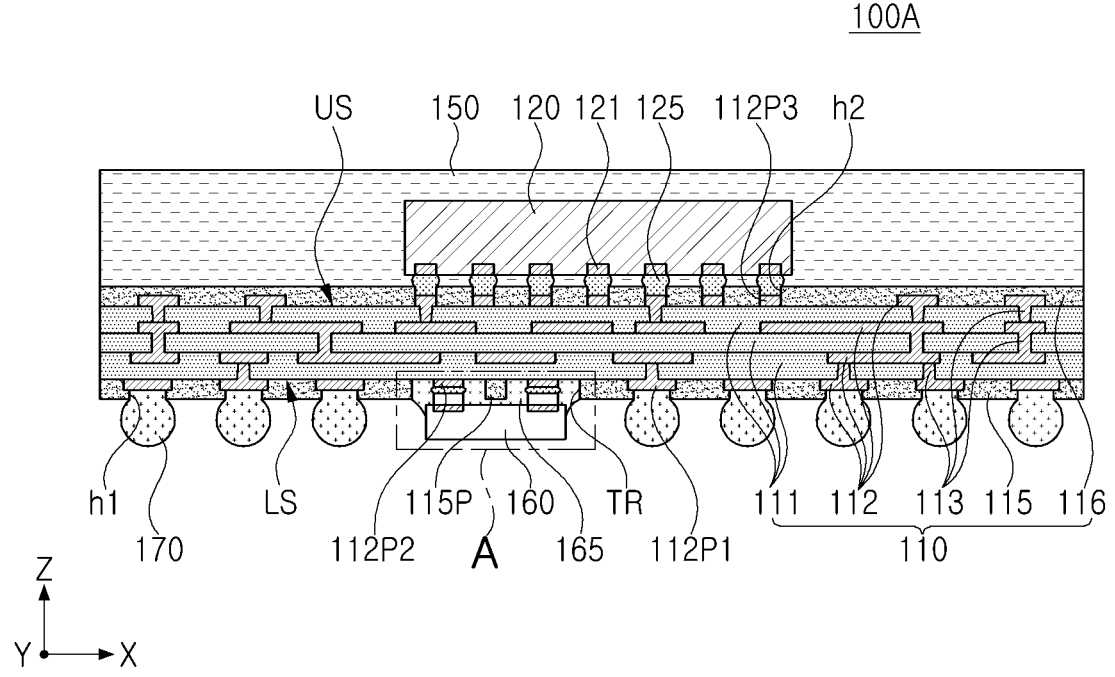
FIG. 1A is a cross-sectional diagram illustrating a semiconductor package according to an example embodiment of the present inventive concept.
Figure 1B:
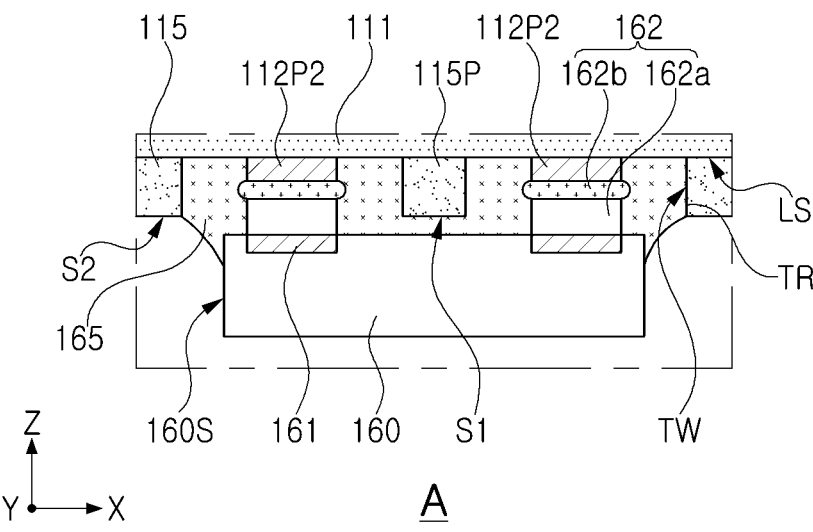
FIG. 1B is an enlarged diagram illustrating region "A" in FIG. 1A.
Figure 1C:
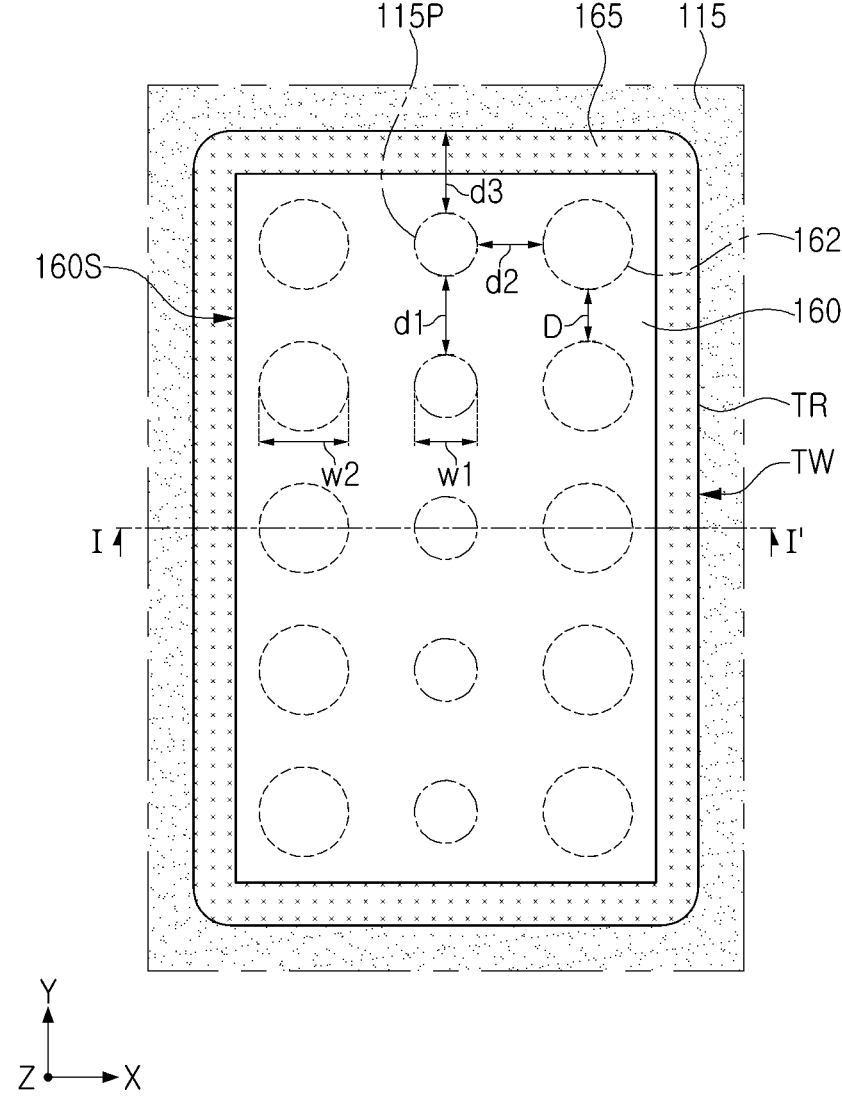
FIG. 1C is a diagram illustrating a lower surface of a semiconductor package corresponding to the portion illustrated in FIG. 1B, viewed from below.

FIG. 1A is a cross-sectional diagram illustrating a semiconductor package 100A according to an example embodiment of the present inventive concept. FIG. 1B is an enlarged diagram illustrating region "A" in FIG. 1A. FIG. 1C is a diagram illustrating a lower surface of a semiconductor package corresponding to the portion illustrated in FIG. 1B, viewed from below. FIG. 1B corresponds to a cross-sectional surface taken along line I-I' in FIG. 1C.

Referring to FIGS. 1A to 1C, a semiconductor package 100A according to an example embodiment of the present inventive concept may include a package substrate 110, a semiconductor chip 120, a passive device 160, and a sealant 165. In an example embodiment of the present inventive concept, the semiconductor package 100A according to an example embodiment of the present inventive concept may further include an encapsulant 150 and a first connection bump 170. For example, there may be a plurality of connection bumps 170. In an example embodiment of the present inventive concept, at least one passive device 160 may be surface-mounted on a lower surface LS of the package substrate 110 such that properties of signal integrity (SI) and/or power integrity (P1) of the semiconductor package 100A may improve. In addition, by forming a support protrusion 115P in a trench TR in which the passive device 160 is mounted, warpage or bending of the package substrate 110 may be prevented when the semiconductor chip 120 is mounted, and connection reliability of the semiconductor chip 120 may increase. In addition, by introducing the sealant 166 that fills an internal region of the trench TR, reliability of the passive device 160 may be secured.

The package substrate 110 may be a support substrate on which the semiconductor chip 120 is mounted, and may be a package substrate for redistributing the connection pads 121 of the semiconductor chip 120. The package substrate 110 may include, for example, a printed circuit board (PCB), a ceramic substrate, a glass substrate, a tape wiring board, and the like. For example, the package substrate 110 may have a lower surface LS and an upper surface US opposing each other, and may include an insulating layer 111, a redistribution layer 112, a redistribution via 113, a lower protective layer 115, and an upper protective layer 116.

The insulating layer 111 may include an insulating resin. The insulating resin may include a thermosetting resin such as an epoxy resin, a thermoplastic resin such as polyimide, or a resin impregnated with an inorganic filler and/or glass fiber (e.g., a glass cloth or glass fabric) in these resins, such as, for example, prepreg, Ajinomoto build-up film (ABF), flame retardant (FR-4), bismaleimide triazine (BT), or photo-imageable dielectric (PID).

The insulating layer 111 may include a plurality of insulating layers 111 stacked in a vertical direction (e.g., a Z-axis direction). An uppermost insulating layer 111 of the plurality of insulating layers 111 may provide an upper surface US of the package substrate 110, and a lowest insulating layer 111 may provide a lower surface LS. Depending on a process, a boundary between the plurality of insulating layers 111 may be indistinct. In an example embodiment of the present inventive concept, the number of insulating layers 111 may be smaller or greater than the example illustrated in the drawings. In an example embodiment of the present inventive concept, a thickness of the core layer disposed in a center of the plurality of insulating layers 111 may be greater than a thickness of the insulating layers 111 stacked on the upper and lower portions of the insulating layer 111. The core layer may be formed using, for example, a copper clad laminate (CCL), an unclad copper clad laminate (unclad CCL), a glass substrate or a ceramic substrate.

The redistribution layer 112 may include, for example, a metal material including copper (Cu), aluminum (Al), silver (Ag), tin (Sn), gold (Au), nickel (Ni), lead (Pb), titanium (Ti), or alloys thereof. The redistribution layer 112 may include, for example, a ground (GrouND: GND) pattern, a power (PoWeR: PWR) pattern, and a signal (S) pattern. The signal (S) pattern may provide a path, other than the ground (GND) pattern and the power (PWR) pattern, for various signals, for example, a data signal, to be transmitted/received through.

The redistribution layer 112 may be provided as a plurality of redistribution layers 112 disposed on the plurality of insulating layers 111, respectively. The plurality of redistribution layers 112 may be electrically connected to each other through the redistribution via 113. The number of the redistribution layers 112 may be determined depending on the number of the insulating layers 111, and may be more or less than the example illustrated in the drawings. The redistribution layers 112 disposed in lowermost and uppermost portions among the plurality of redistribution layers 112 may include pads on which the semiconductor chip 120, the passive device 160, and the connection bumps 125 and 170 are mounted. The pads may be formed to have different pitches depending on a component to be mounted thereon.

For example, the redistribution layer 112 may include first pads 112P1, second pads 112P2 and third pads 112P3. The first pads 112P1 and the second pads 112P2 may be disposed on the lower surface LS, and the third pads 112P3 may be disposed on the upper surface US. The first pads 112P1 may be connected to the first connection bumps 170. The second pads 112P2 may be connected to the passive device 160 and may have a pitch smaller than that of the first pads 112P1. The third pads 112P3 may be connected to the semiconductor chip 120. The first pads 112P1, the second pads 112P2, and the third pads 112P3 may be electrically connected to each through the redistribution layer 112 and the redistribution via 113.

The redistribution via 113 may be electrically connected to the redistribution layer 112 and may include a signal via, a ground via, and a power via. The redistribution via 113 may include, for example, a metal material including copper (Cu), aluminum (Al), silver (Ag), tin (Sn), gold (Au), nickel (Ni), lead (Pb), or titanium (Ti), or alloys thereof. The redistribution via 113 may have a form of a filled via in which a metal material is filled in a via hole or a conformal via in which a metal material is formed along an internal wall of the via hole. The redistribution via 113 may be integrated with the redistribution layer 112, but an example embodiment thereof is not limited thereto.

The lower protective layer 115 and the upper protective layer 116 may be solder resist layers protecting the redistribution layer 112 from external physical/chemical damages. The solder resist layer may include an insulating material, and may be formed using, for example, prepreg, ABF, FR-4, BT, or photo solder resist (PSR). The lower protective layer 115 may be disposed on the lower surface LS of the package substrate 110, and may include a first opening h1 and a trench TR exposing at least a portion (e.g., pads) of the redistribution layer 112. For example, the first openings h1 may expose at least a portion of each of the first pads 112P1, and the trench TR may expose the second pads 112P2. The upper protective layer 116 may have a second opening h2 exposing at least a portion of the redistribution layer 112, that is, for example, the third pads 112P3.

The trench TR may be a region in which the passive device 160 is mounted, and may be formed to have a shape similar to a planar shape of the passive device 160. In an example embodiment of the present inventive concept, the trench TR may be formed to have a shape having an extension area used as an injection hole of the sealant 165 on one side thereof (see FIG. 5B). The second pads 112P2 that are connected to the connection electrode 161 of the passive device 160 may be exposed. On the X-Y plane, the trench TR may have a planar area larger than that of the passive device 160. For example, the trench TR may have a sidewall TW at least partially surrounding the second pads 112P2. For example, one trench TR may expose an entirety of the two or more second pads 112P2 electrically connected to the passive device 160. When pressure is applied to the upper surface US of the package substrate 110 in the process of mounting the semiconductor chip 120, the package substrate 110 may be bent in the trench TR region. In an example embodiment of the present inventive concept, warpage or bending of the package substrate 110 may be prevented by forming the support protrusion 115P in the trench TR. For example, the trench TR in which the support protrusion 115P is formed may overlap the semiconductor chip 120 or the third pads 112P3 in a direction (e.g., Z-direction) substantially perpendicular to the lower surface LS of the package substrate 110, which will be described later with reference to FIGS. 2A to 3C.

The support protrusion 115P may include a plurality of support protrusions 115P disposed in the trench TR. However, the support protrusion 115P may be provided as one or two or more support protrusions 115P depending on the area or size of the trench TR. The position of the support protrusion 115P in the trench TR is not limited to any particular example, and may be varied in consideration of a spacing distance from the bump structures 162 (see FIGS. 4A and 4B). Since the plurality of support protrusions 115P are formed to have substantially the same height as that of the lower protective layer 115, the plurality of support protrusions 115P may support the package substrate 110 during the process of mounting the semiconductor chip 120. For example, the lower surface S1 of the plurality of support protrusions 115P may be substantially on the same level as a level of the lower surface S2 of the lower protective layer 115.

The plurality of support protrusions 115P may be spaced apart from each other with a predetermined distance therebetween in the trench TR to secure filling properties of the sealant 165. For example, the plurality of support protrusions 115P may be spaced apart from each other by a first distance d1, and may be spaced apart from the bump structure 162 by a second distance d2. In addition, some of the plurality of support protrusions 115P may be spaced apart from a sidewall TW of the trench TR by a third distance d3. Here, the first distance d1, the second distance d2, and the third distance d3 may be substantially equal to or greater than the spacing distance D between the bump structures 162. The first distance d1, the second distance d2, and the third distance d3 may be in the range of about 10 μm to about 200 μm. When the first distance d1, the second distance d2, and the third distance d3 are less than about 10 μm, the filling properties of the sealant 165 may be reduced. When the first distance d1, the second distance d2, and the third distance d3 exceed about 200 μm, the effect of supporting the package substrate 110 may be insignificant. In addition, the plurality of support protrusions 115P may have a cylindrical shape extending vertically, but an example embodiment thereof is not limited thereto. In an example embodiment of the present inventive concept, the plurality of support protrusions 115P may have a shape of a triangular prism or a quadrangular prism. In addition, the diameter or width w1 of the plurality of support protrusions 115P may be substantially the same as or smaller than the diameter or width w2 of the bump structures 162 on a plane (X-Y plane). When the diameter or width w1 of the plurality of support protrusions 115P is greater than the diameter or width w2 of the bump structures 162, the filling properties of the sealant 165 may be reduced. The diameter or width w1 of the plurality of support protrusions 115P may be in the range of about 100 μm to about 300 μm. The diameter or width w1 of the plurality of support protrusions 115P may be varied depending on the arrangement of the bump structures 162 and the area of the trench TR.

The semiconductor chip 120 may include connection pads 121 that are disposed on the upper surface US of the package substrate 110 and that are electrically connected to the redistribution layer 112. The semiconductor chip 120 may include, for example, silicon (Si), germanium (Ge), or gallium arsenide (GaAs), and various types of integrated circuits may be formed therein. The integrated circuit may be a processor chip such as a central processor (e.g., CPU), graphics processor (e.g., GPU), field programmable gate array (FPGA), application processor (AP), digital signal processor, cryptographic processor, microprocessor, microcontroller, or the like, but an example embodiment thereof is not limited thereto, and the integrated circuit may be a logic chip such as an analog-to-digital converter, or a memory chip, such as volatile memory (e.g., DRAM), non-volatile memory (e.g., ROM and flash memory). The connection pad 121 may be implemented as a pad (e.g., an aluminum (Al) pad) of a bare chip, but in an example embodiment of the present inventive concept, the connection pad 121 may be a pad (e.g., a copper (Cu) pad) of a packaged chip. The semiconductor chip 120 may be mounted on the package substrate 110 by a flip-chip method. The connection pad 121 may be connected to the redistribution layer 112 through bumps in the form of balls or pillars. For example, the semiconductor chip 120 may be electrically connected to the third pads 112P3 through the second connection bump 125. The second connection bump 125 may be disposed in each of the second openings h2 of the upper protective layer 116, and may electrically connect the connection pads 121 and the third pads 112P3 to each other.

The encapsulant 150 may encapsulate at least a portion of the semiconductor chip 120 on the upper surface US of the package substrate 110. The encapsulant 150 may include, for example, prepreg, ABF, FR-4, BT, epoxy molding compound (EMC) including a thermosetting resin such as an epoxy resin, a thermoplastic resin such as polyimide, or inorganic filler and/or glass fiber. The encapsulant 150 may have a molded underfill (MUF) structure integrated with the underfill resin disposed between the semiconductor chip 120 and the package substrate 110, but an example embodiment thereof is not limited thereto. In an example embodiment of the present inventive concept, the encapsulant 150 may have a capillary underfill (CUF) structure in which the underfill resin disposed below the semiconductor chip 120 is distinct.

The passive device 160 may include connection terminals 161 disposed in the trench TR of the lower protective layer 115 and electrically connected to the second pads 112P2. The passive device 160 may be disposed such that the connection terminals 161 may face the lower surface LS of the package substrate 110. The passive device 160 may include, for example, a capacitor, an inductor, or beads. The connection terminals 161 may be electrically connected to the second pads 112P2 through the bump structures 162. The bump structures 162 may have a shape similar to that of the plurality of support protrusions 115P. For example, the bump structures 162 may have a circular shape on a plane (X-Y plane) that is parallel to the lower surface LS of the package substrate 110, but an example embodiment thereof is not limited thereto. In addition, the diameter or width w2 of the bump structures 162 may be substantially the same as or greater than the diameter or width w1 of the plurality of support protrusions 115P. The bump structures 162 may be balls or pillar-shaped structures (e.g., a cylindrical shape). For example, the bump structures 162 may include a pillar portion 162a and a solder portion 162b. The pillar portion 162a may be in contact with the connection terminals 161, and the solder portion 162b may be disposed between the pillar portion 162a and a corresponding second pad of the plurality of second pads 112P2. A sealant 165 surrounding the bump structures 162 may be disposed between the passive device 160 and the package substrate 110.

The sealant 165 may include an insulating resin similar to that of the encapsulant 150. The sealant 165 may be formed using, for example, an insulating resin such as an epoxy resin. The sealant 165 may cover at least a portion of the passive device 160 and may extend into the trench TR. Accordingly, the sealant 165 may fill a space between the sidewall TW of the trench TR and the second pads 112P2 and may at least partially surround the plurality of support protrusions 115P and the bump structures 162. For example, the sealant 165 may be in contact with a side surface of each of the plurality of support protrusions 115P and the bump structures 162. For example, the sealant 165 may be in contact with an entirety of the side surface of each of the plurality of support protrusions 115P and the bump structures 162.

The first connection bump 170 may be disposed in each of the first openings h1 of the lower protective layer 115, and may be electrically connected to the first pads 115P1. The first connection bump 170 may physically and/or electrically connect the semiconductor package 100A to an external device. The first connection bump 170 may include a conductive material and may have a shape of ball, pin, or lead. For example, the first connection bump 170 may be a solder ball. The first connection bump 170 may have a height greater than a height of the passive device 160 in a direction (e.g., the Z-direction) substantially perpendicular to the lower surface LS.

Hereinafter, the effect of preventing bending of the package substrate 110 by the support protrusion 115P and increasing reliability of the semiconductor chip 120 will be described with reference to FIGS. 2A to 3C.

Figure 2A:
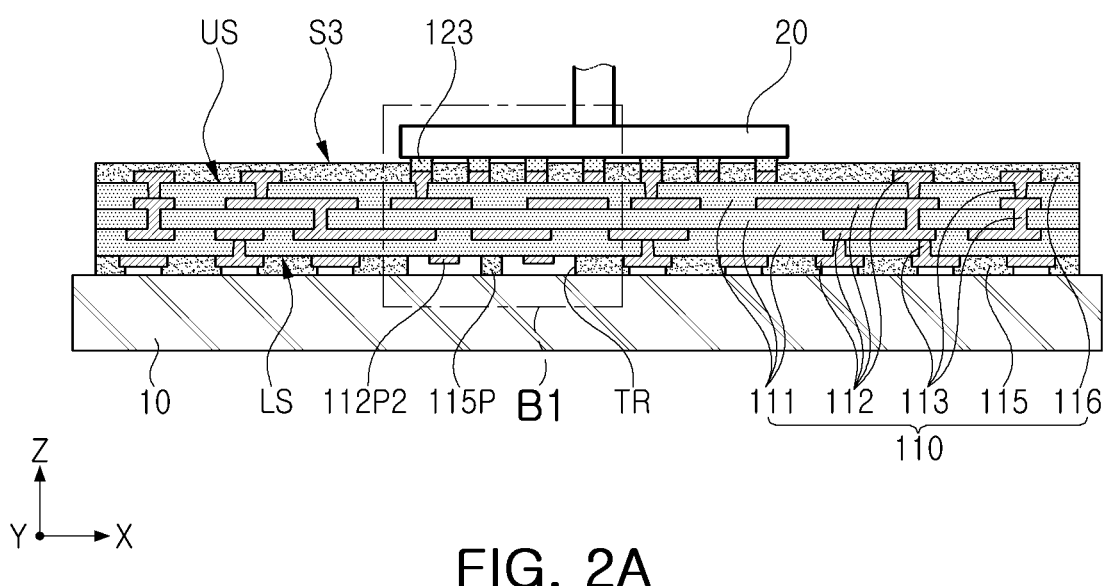
FIGS. 2A, 2B and 2C are cross-sectional diagrams illustrating a process in which a semiconductor chip is mounted on a package substrate according to an example embodiment of the present inventive concept.
Figure 2B:
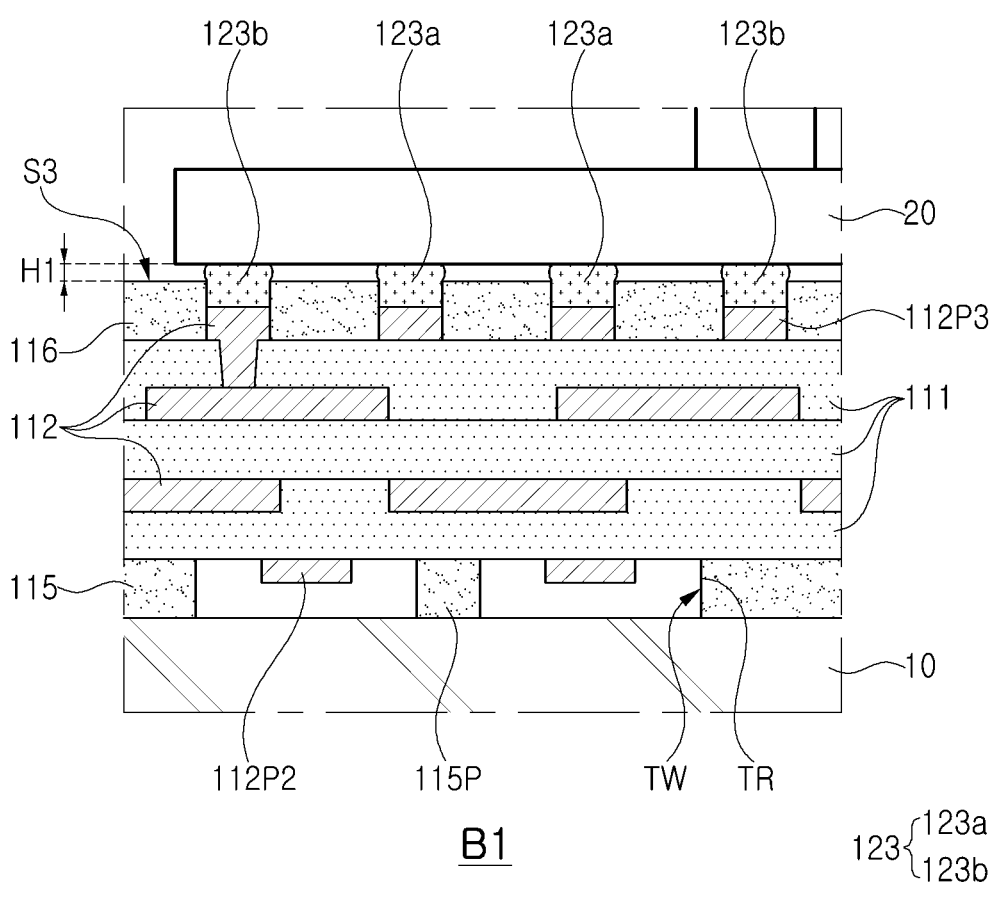
Figure 2C:
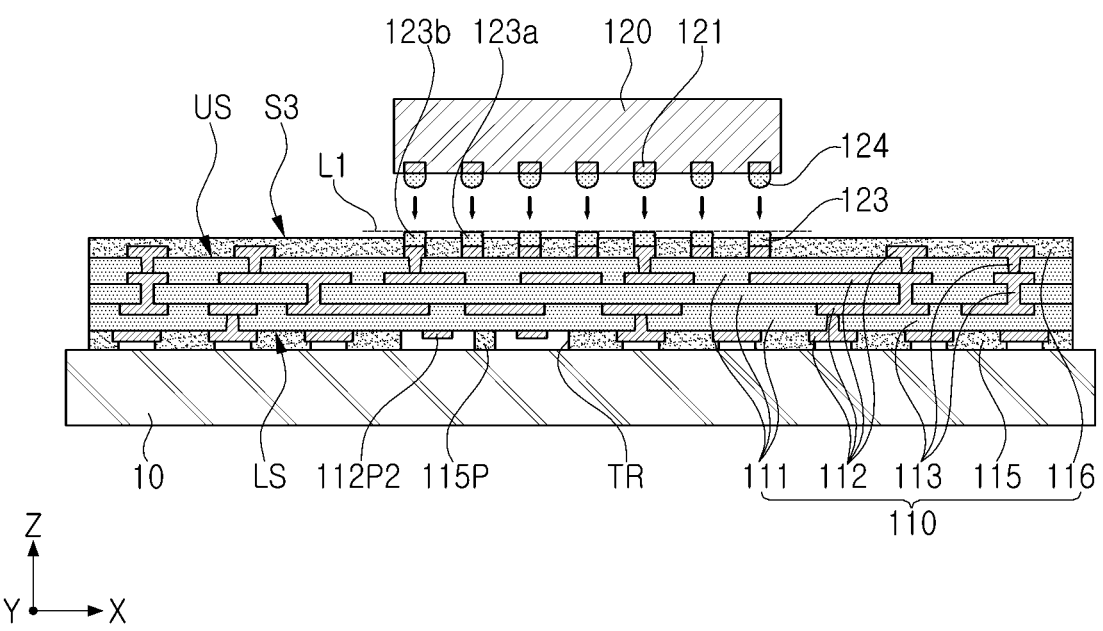

FIGS. 2A to 2C are cross-sectional diagrams illustrating a process in which a semiconductor chip 120 is mounted on a package substrate 110 according to an example embodiment of the present inventive concept. FIG. 2B is an enlarged diagram illustrating region "B1" in FIG. 2A.

Referring to FIGS. 2A and 2B, for the flip-chip process, a process (e.g., a coining process) of compressing the first preliminary bumps 123 bumped on the package substrate 110 may be performed. The package substrate 110 may be temporarily attached to the carrier substrate 10. The first preliminary bumps 123 may be disposed on the redistribution layer 112 of the package substrate 110. The first preliminary bumps 123 may have substantially flat upper surfaces by being compressed by the coining device 20. The trench TR and the support protrusion 115P may be formed by patterning the lower protective layer 115.

The support protrusion 115P may be in contact with the carrier substrate 10 in the trench TR. When a load is applied to the package substrate 110 by the coining device 20, the lower surface LS of the package substrate 110 may be supported such that the package substrate 110 may be prevented from being bent in the trench TR region. Accordingly, the first preliminary bumps 123 may be formed to have substantially the same height H1 as each other. For example, the first preliminary bumps 123 may include 1-1 preliminary bumps 123a and 1-2 preliminary bumps 123b. The 1-1 preliminary bumps 123a may be adjacent to the center of the trench TR, and the 1-2 preliminary bumps 123b may be adjacent to an outer edge of the trench TR. For example, the 1-1 preliminary bumps 123a may overlap the center of the trench TR, and the 1-2 preliminary bumps 123b may overlap an outer edge of the trench TR. The height H1 from the upper protective layer 116 to the upper surface of the 1-1 preliminary bumps 123a and the upper surface of the 1-2 preliminary bumps 123b may be substantially the same.

Referring to FIG. 2C, the semiconductor chip 120 may be attached to the package substrate 110. Second preliminary bumps 124 may be bumped on the connection pads 121 of the semiconductor chip 120. In this case, since the coined upper surfaces of the first preliminary bumps 123 are disposed on substantially the same level L1, the second preliminary bumps 124 and the first preliminary bumps 123 may be formed to be stably in contact with each other. Thereafter, by performing a reflow process, the first preliminary bumps 123 and the second preliminary bumps 124 may be integrated with each other. As warpage or bending of the package substrate 110 may be prevented by the support protrusion 115P, and the first preliminary bumps 123 may be coined to have a uniform height as above, defects (e.g., short circuits, or the like) occurring during the flip-chip process and the reflow process may be prevented.

Figure 3A:
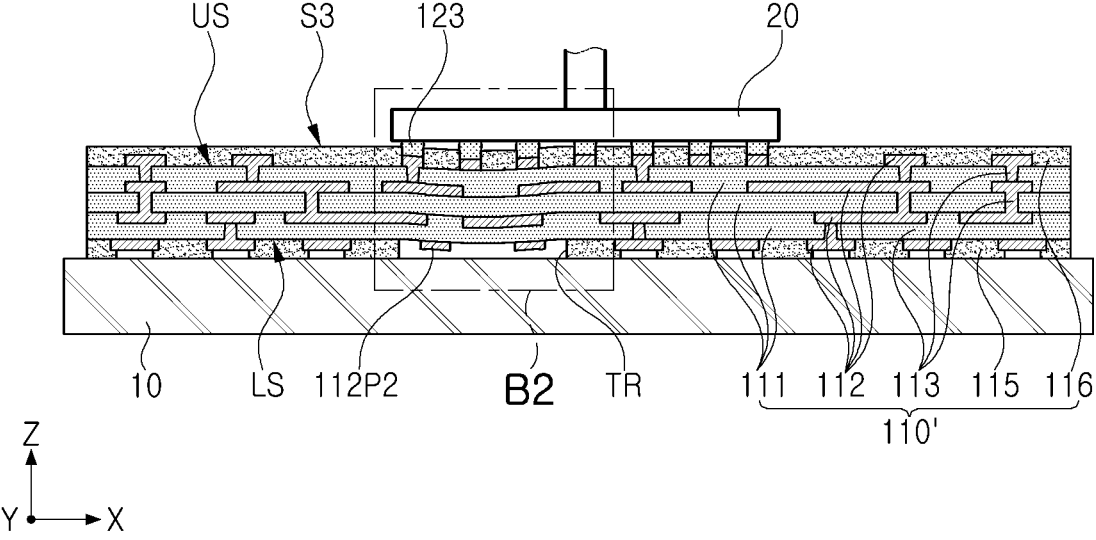
FIGS. 3A, 3B and 3C are cross-sectional diagrams illustrating a process in which a semiconductor chip is mounted on a package substrate according to a comparative example.
Figure 3B:
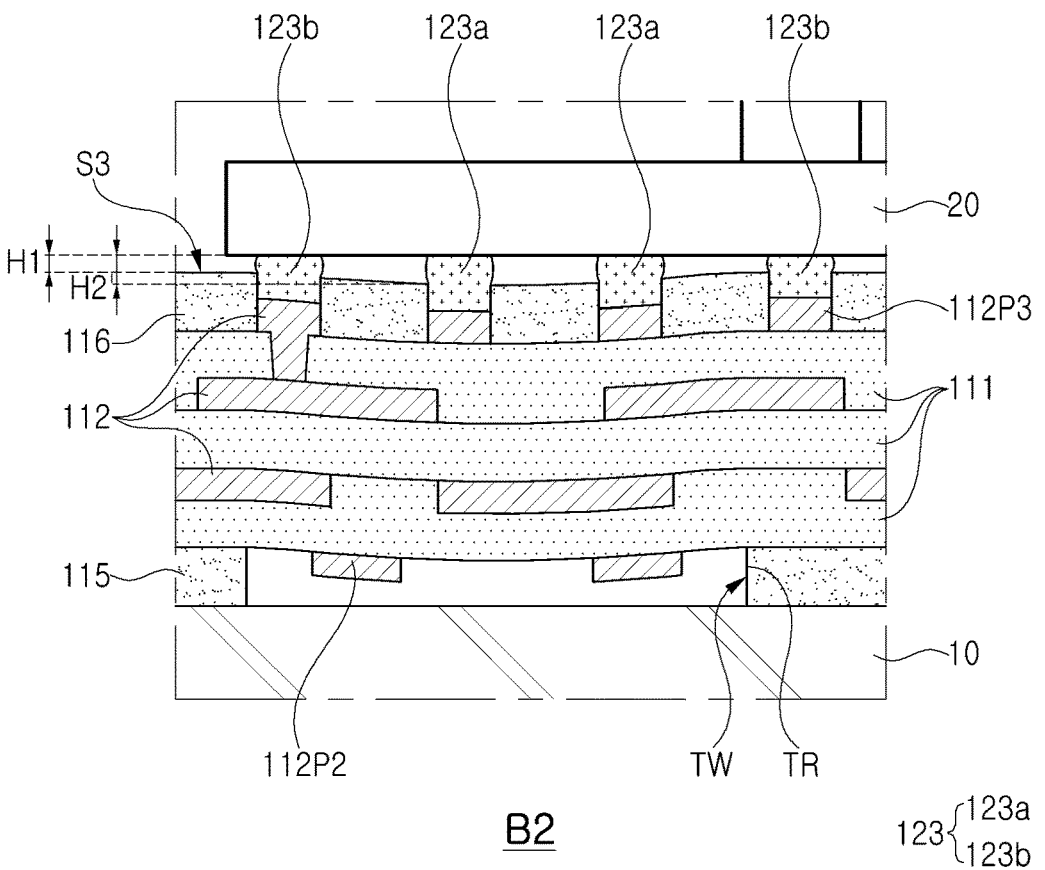
Figure 3C:
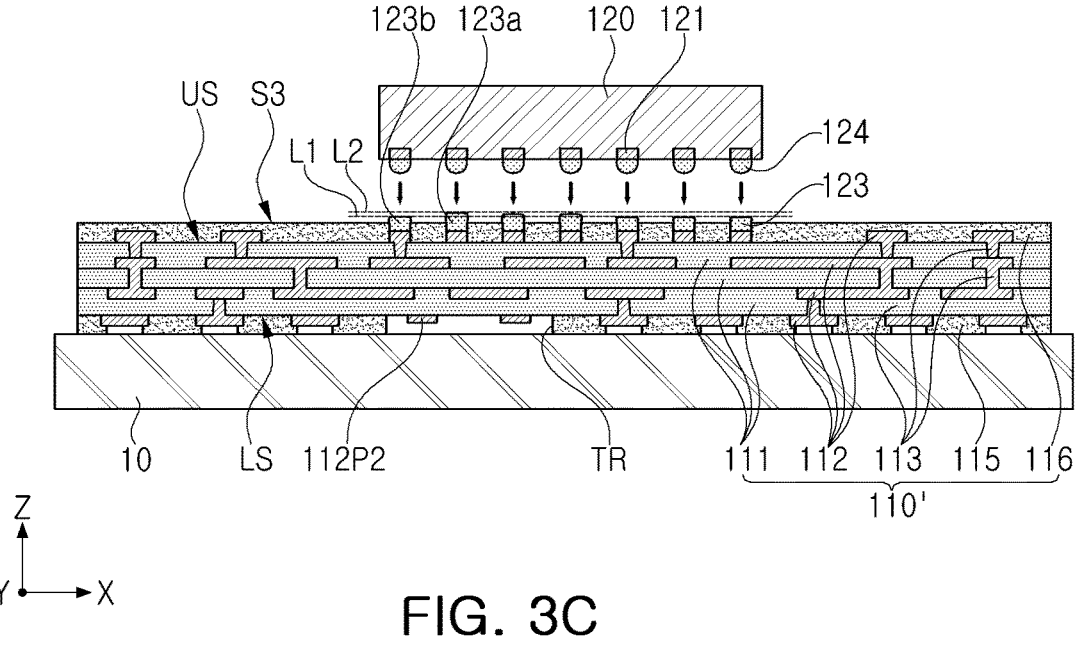

FIGS. 3A to 3C are cross-sectional diagrams illustrating a process in which a semiconductor chip 120 is mounted on a package substrate 110' according to a comparative example. FIG. 3B is an enlarged diagram illustrating region "B2" in FIG. 3A.

Referring to FIGS. 3A and 3B, for the flip-chip process, a process (e.g., a coining process) of pressing first preliminary bumps 123 bumped on the package substrate 110' in the comparative example may be performed. The package substrate 110' in the comparative example may be temporarily attached to the carrier substrate 10. The first preliminary bumps 123 may be disposed on the redistribution layer 112 of the package substrate 110' in the comparative example. The first preliminary bumps 123 may have flat upper surfaces by being compressed by the coining device 20.

When a load is applied to the package substrate 110' in the comparative example by the coining device 20, the package substrate 110' in the comparative example may be bent in the trench TR region. Accordingly, the first preliminary bumps 123 adjacent to (e.g., overlapping) the trench TR may be formed to have different heights from each other. For example, the first preliminary bumps 123 may include 1-1 preliminary bumps 123a and 1-2 preliminary bumps 123b. The 1-1 preliminary bumps 123a may be adjacent to (e.g., overlapping) the center of the trench TR, and the 1-2 preliminary bumps 123b may be adjacent to (e.g., overlapping) the outer edge of the trench TR. A first height H1 from the upper protective layer 116 to the upper surfaces of the 1-2 preliminary bumps 123b may be lower than a second height H2 from the upper protective layer 116 to the upper surfaces of the 1-1 preliminary bumps 123*a*.

Referring to FIG. 3C, the semiconductor chip 120 may be attached to the package substrate 110' in the comparative example. Second preliminary bumps 124 may be bumped on the connection pads 121 of the semiconductor chip 120. In this case, since the upper surfaces of the coined first preliminary bumps 123 are disposed on different levels from each other, over-pressurization or non-contact with the second preliminary bumps 124 may occur depending on the height of the first preliminary bumps 123. For example, upper surfaces of the coined 1-2 preliminary bumps 123*b* may be on the first level L1, and upper surfaces of the coined 1-1 preliminary bumps 123*a* may be on the second level L2, which is higher than the first level L1. As warpage or bending of the package substrate 110' in the comparative example occurs in the trench TR region and as the first preliminary bumps 123 are not coined to have a uniform height, defects (e.g., short circuits, etc.) may occur during the flip-chip process and the reflow process.

Figure 4A:
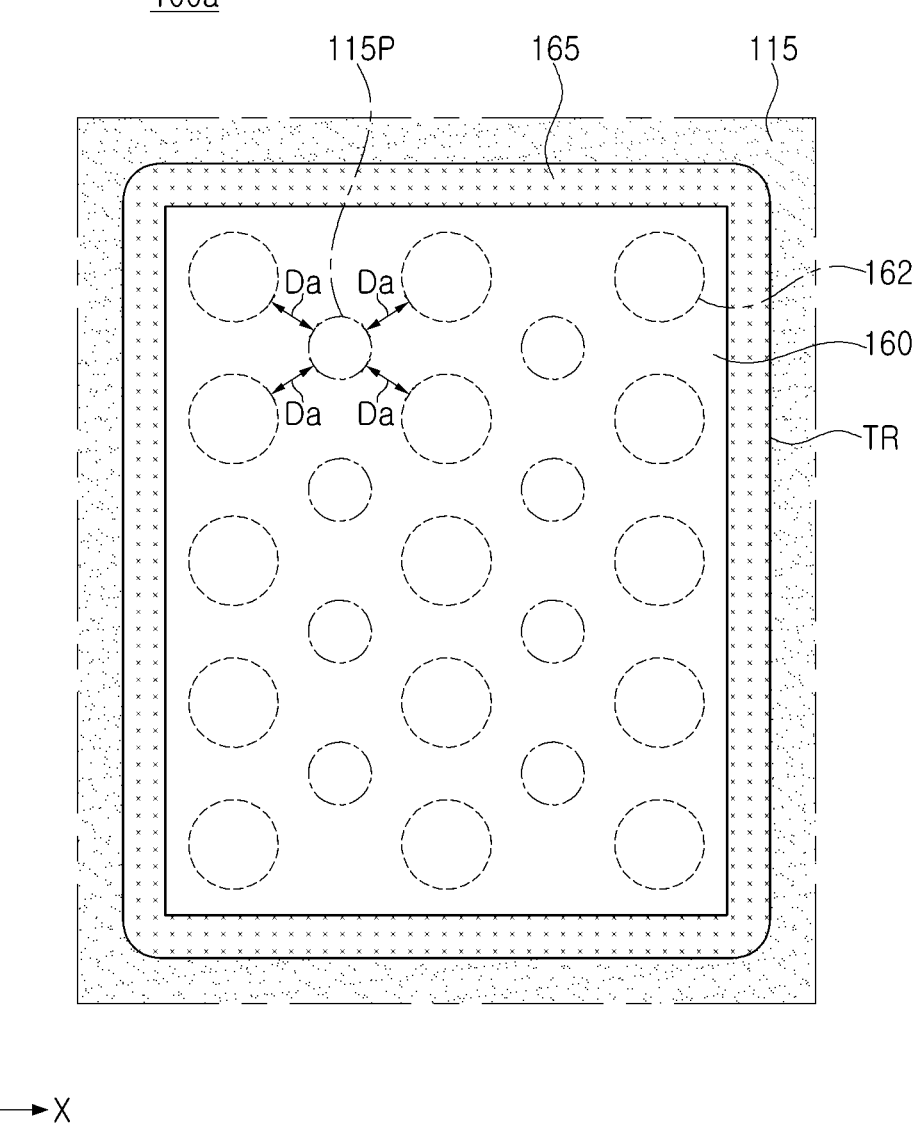
FIGS. 4A and 4B are diagrams illustrating a modified example of a semiconductor package according to an example embodiment of the present inventive concept.
Figure 4B:
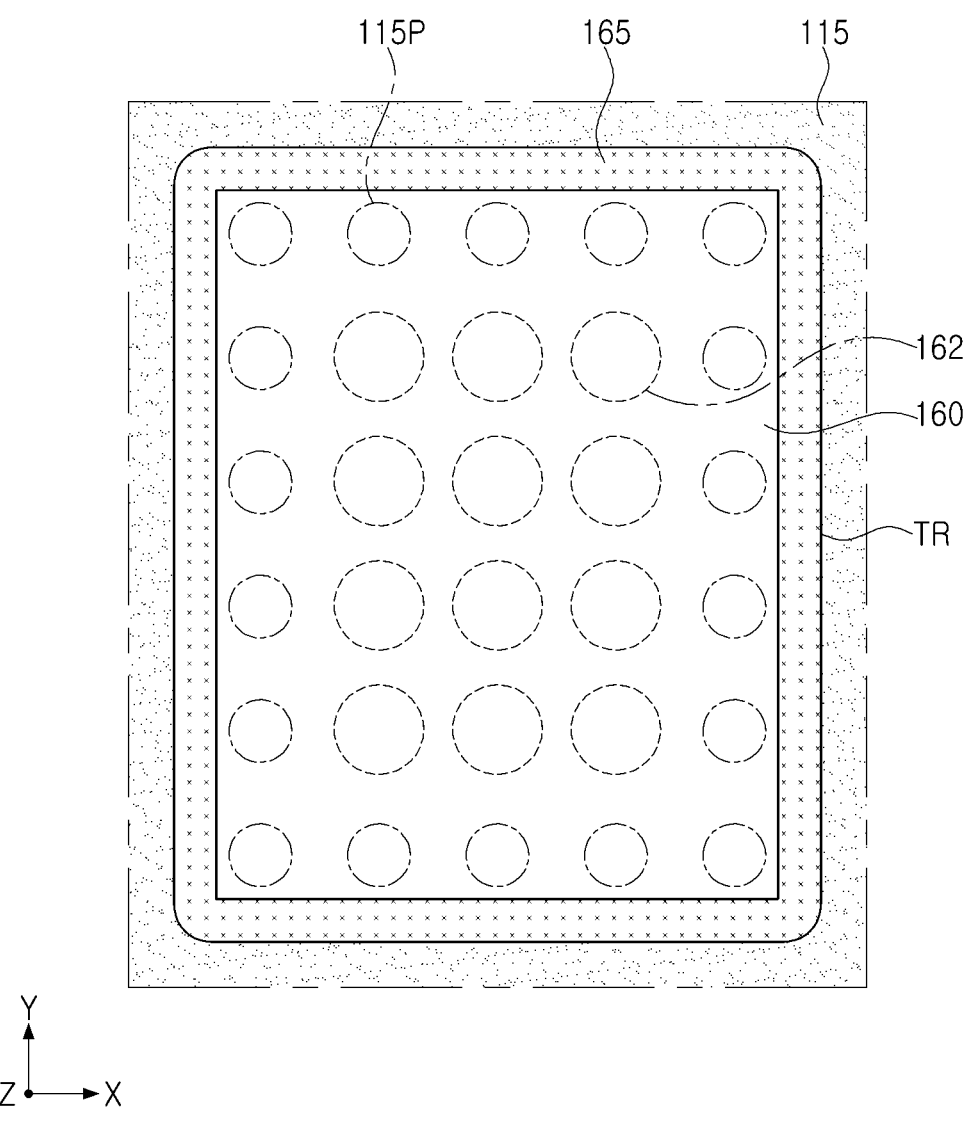

FIGS. 4A and 4B are diagrams illustrating a modified example of a semiconductor package according to an example embodiment of the present inventive concept.

Referring to FIG. 4A, in the semiconductor package 100*a* according to an example embodiment of the present inventive concept, the support protrusion 115P may be disposed such that a spacing distance Da from the bump structures 162 may be maximized. For example, the support protrusion 115P may be disposed between the bump structures 162 arranged in a matrix. For example, the support protrusion 115P may be disposed between four bump structures 162; however, the present inventive concept is not limited thereto. As another example, a column of bump structures 162 is arranged in a first direction (e.g., a Y-axis direction), and a column of support protrusions 115P, which is arranged in the first direction and adjacent to the column of bump structures 162 in a second direction (e.g., an X-axis direction), is misaligned with the column of bump structures 162. A spacing distance Da between the support protrusion 115P and the adjacent bump structures 162 may be substantially the same, but an example embodiment thereof is not limited thereto. The spacing distance Da may be in the range of about 10 μm to about 200 μm. In the drawing, the bump structures 162 may be arranged in three rows, but in example embodiments of the present inventive concept, the bump structures 162 may be arranged in two rows or four or more rows.

Referring to FIG. 4B, in the semiconductor package 100*b* according to an example embodiment of the present inventive concept, the support protrusion 115P may be disposed in an outer region of the passive device 160. For example, a plurality of support protrusions 115P may be disposed to surround the bump structures 162 arranged in a matrix. As another example, the support protrusions 115P may be disposed adjacent to the edge of the passive device 160. In the drawing, the bump structures 162 may be arranged in three rows, but in example embodiments, the bump structures 162 may be arranged in two rows or four or more rows. In addition, depending on the arrangement of the bump structures 162, at least a portion of the support protrusions 115P may be disposed between the bump structures 162. The position of the support protrusion 115P in the trench TR is not limited to any particular example as above. In modified examples, the support protrusion 115P may be disposed in a position which does not overlap the passive device 160 in the vertical direction (e.g., the Z-direction).

Figure 5A:
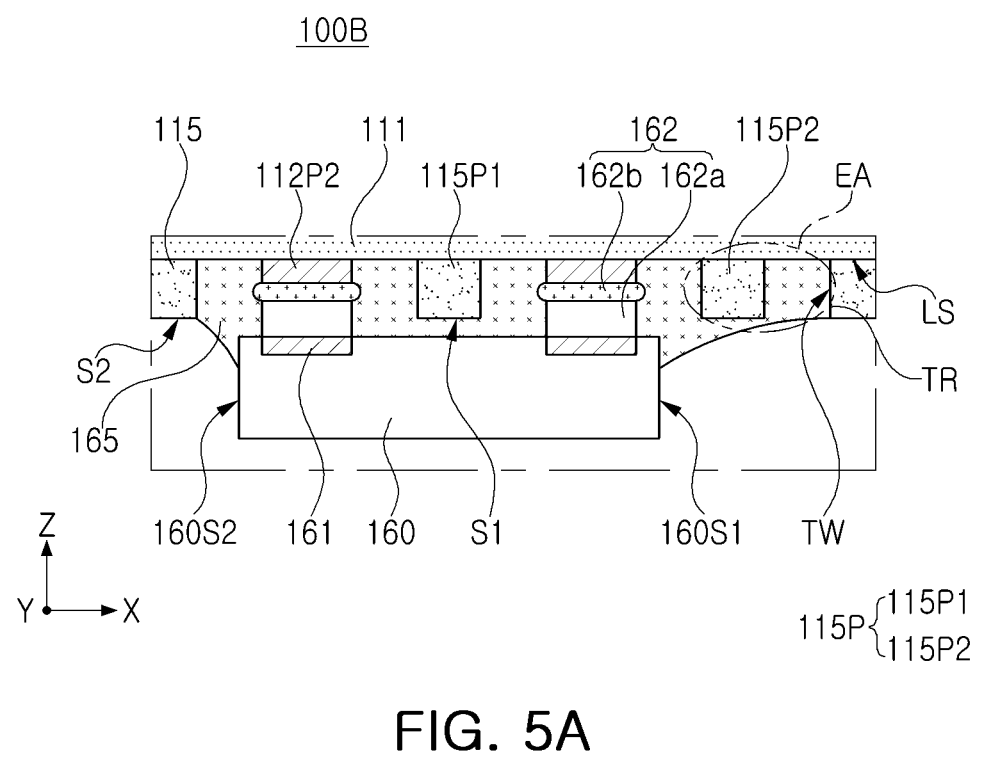
Figure 5B:
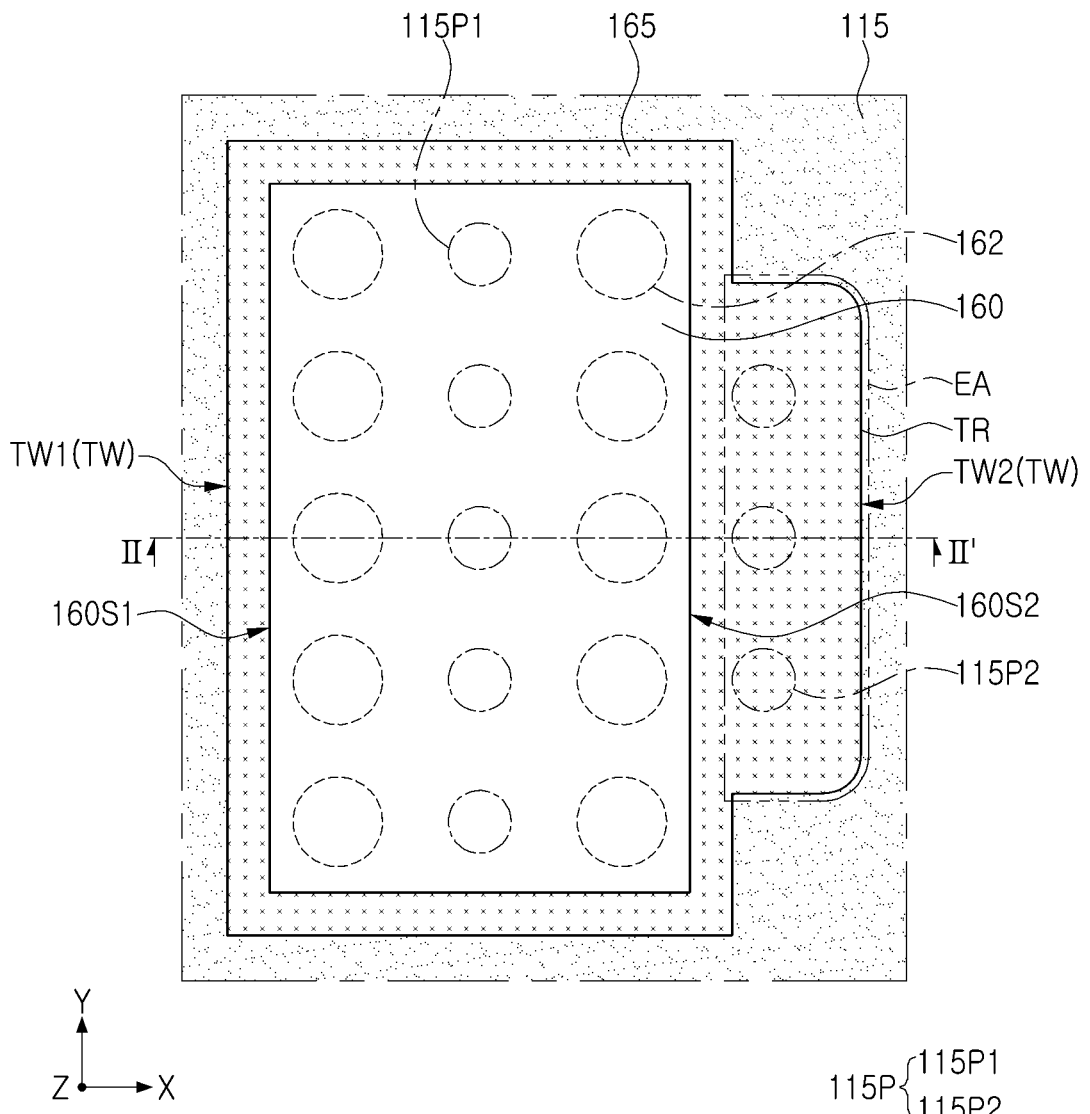
FIG. 5B is a diagram illustrating a lower surface of a semiconductor package corresponding to the portion illustrated in FIG. 5A, viewed from below.

FIG. 5A is an enlarged diagram illustrating a portion of a region of a semiconductor package 100B according to an example embodiment of the present inventive concept. FIG. 5B is a diagram illustrating a lower surface of a semiconductor package corresponding to the portion illustrated in FIG. 5A, viewed from below. FIG. 5A illustrates a region corresponding to FIG. 1B in a semiconductor package 100B. FIG. 5A corresponds to a cross-sectional surface taken along line II-II' in FIG. 5B.

Referring to FIGS. 5A and 5B, the semiconductor package 100B according to an example embodiment of the present inventive concept may be configured the same as or similarly to the aforementioned example embodiment described with reference to FIGS. 1A, 1B, 1C, 4A, and 4B except for the configuration in which the trench TR has an extension area EA formed on one side thereof. In the present example embodiment, the trench TR may have an extension area EA adjacent to one side of the passive device 160. For example, the trench TR may include a first sidewall TW1 facing the first side surface 160S1 of the passive device 160 and a second sidewall TW2 facing the second side surface 160S2 of the passive device 160. In this case, at least a portion of the second sidewall TW2 may form an extension area EA spaced apart from the second sidewall 160S2 by a distance larger than the distance between the first sidewall TW1 of the trench TR and the first sidewall 160S1 of the passive device 160. The extension area EA may be used as an inlet for the sealant 165.

In an example embodiment of the present inventive concept, the support protrusion 115P may be disposed in the expansion area EA. For example, the plurality of support protrusions 115P may include at least one first support protrusion 115P1, which overlaps the passive device 160 in the vertical direction (e.g., the Z-direction), and at least one second support protrusion 115P2, which does not overlap the passive device 160. The at least one second support protrusion 115P2 may be disposed in the extension area EA of the trench TR. As described above, by disposing the second support protrusion 115P2 in the extension area EA, reliability and yield of the semiconductor package 100B may be increased.

Figure 6:
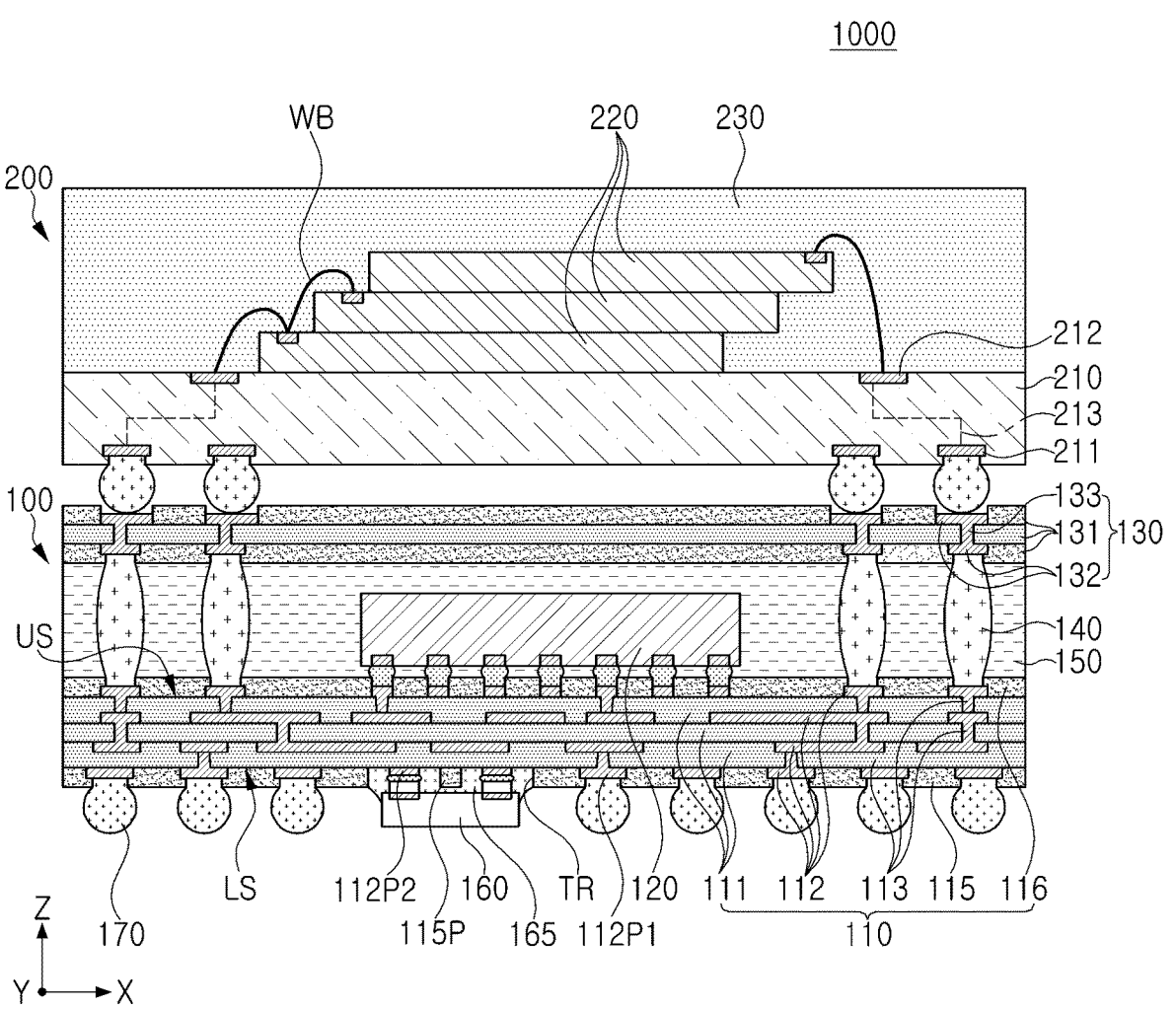
FIG. 6 is a cross-sectional diagram illustrating a semiconductor package according to an example embodiment of the present inventive concept.

FIG. 6 is a cross-sectional diagram illustrating a semiconductor package 1000 according to an example embodiment of the present inventive concept.

Referring to FIG. 6, the semiconductor package 1000 according to an example embodiment of the present inventive concept may include a first package 100 and a second package 200. The first package 100 may be configured the same as or similarly to the aforementioned example embodiment described with reference to FIGS. 1A, 1B, 1C, 4A, 4B, 5A, and 5B except for the configuration in which an interposer substrate 130 and a connection structure 140 are further included.

The interposer substrate 130 may provide a redistribution layer on the upper or rear surface of the first package 100, and may be disposed between the lower package and the upper package in the package-on-package structure. The interposer substrate 130 may be disposed on the semiconductor chip 120, and may include an upper insulating layer 131, an upper wiring layer 132, and a wiring via 133. The upper insulating layer 131, the upper wiring layer 132, and the wiring via 133 may be respectively configured the same as or similarly to the insulating layer 111, the redistribution layer 112, and the redistribution via 113 of the package substrate 110 described above, and overlapping descriptions will not be provided. The upper insulating layer 131 may also be provided as a plurality of insulating layers. The uppermost upper insulating layer 131 and the lowermost upper insulating layer 131 may be a solder resist layer protecting the upper wiring layer 132. The uppermost upper insulating layer 131 and the lowermost upper insulating layer 131 may include openings exposing at least a portion of the upper wiring layer 132.

The connection structure 140 may be disposed between the package substrate 110 and the interposer substrate 130, and may electrically connect the package substrate 110 to the interposer substrate 130. The connection structure 140 may extend in a vertical direction (e.g., the Z-direction) between the package substrate 110 and the interposer substrate 130 and may provide a vertical connection path that electrically connects the redistribution layer 112 to the upper wiring layer 132. For example, the connection structure 140 may have a spherical or ball shape formed of a low-melting-point metal such as, for example, tin (Sn), indium (In), bismuth (Bi), antimony (Sb), copper (Cu), silver (Ag), zinc (Zn), or lead (Pb) or an alloy (e.g., Sn—Ag—Cu) including the aforementioned elements. In an example embodiment of the present inventive concept, a core ball formed of a polymer material including a thermoplastic resin, a thermo-setting resin, or a metal material distinguished from solder may be disposed in the connection structure 140.

The second package 200 may include a redistribution substrate 210, a second semiconductor chip 220, and a second encapsulant 230. The redistribution substrate 210 may include a lower pad 211 and an upper pad 212 on the lower surface and the upper surface, respectively, which may be electrically connected to an external entity. In addition, the redistribution substrate 210 may include a redistribution circuit 213 electrically connecting the lower pad 211 and the upper pad 212 to each other.

The second semiconductor chip 220 may be mounted on the redistribution substrate 210 by wire bonding or flip-chip bonding. For example, the plurality of second semiconductor chips 220 may be vertically stacked on the redistribution substrate 210 and may be electrically connected to the upper pad 212 of the redistribution substrate 210 by a bonding wire WB. For example, the second semiconductor chip 220 may include a memory chip, and the first semiconductor chip 120 of the first package 100 may include an AP chip.

The second encapsulant 230 may include a material the same as or similar to the encapsulant 150 of the first package 100. The second package 200 may be physically and electrically connected to the first package 100 by conductive bumps. The conductive bumps may be electrically connected to the redistribution circuit 213 in the redistribution substrate 210 through the lower pad 211 of the redistribution substrate 210. The conductive bump may include a low melting point metal, such as, for example, tin (Sn) or an alloy including tin (Sn).

The semiconductor package 1000 in an example embodiment of the present inventive concept may include the first package 100 having increased reliability and yield. Accordingly, in an example embodiment of the present inventive concept, a package-on-package structure having increased reliability may be implemented.

According to the aforementioned example embodiments of the present inventive concept, a semiconductor package including semiconductor chips having increased connection reliability may be provided.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package, comprising:
   a package substrate having upper and lower surfaces opposing each other, and including a redistribution layer, a lower protective layer, and a plurality of support protrusions, wherein the redistribution layer has first and second pads disposed on the lower surface of the package substrate, wherein the lower protective layer has first openings and a trench, wherein the first openings expose at least a portion of each of the first pads, wherein the trench exposes the second pads, and wherein the plurality of support protrusions are disposed in the trench;
   a semiconductor chip disposed on the upper surface of the package substrate and including connection pads electrically connected to the redistribution layer;
   an encapsulant disposed on at least a portion of the semiconductor chip;
   first connection bumps disposed in the first openings of the lower protective layer, respectively, and electrically connected to the first pads, respectively,
   a passive device disposed in the trench of the lower protective layer and electrically connected to the second pads; and
   a sealant covering at least a portion of the passive device and extending into the trench,
   wherein at least one of the plurality of support protrusions overlaps the passive device in a direction substantially perpendicular to the lower surface of the package substrate.

2. The semiconductor package of claim 1, further comprising:
   bump structures connecting the second pads to connection terminals of the passive device.

3. The semiconductor package of claim 2, wherein each of a first distance that is between the plurality of support protrusions and a second distance that is between the plurality of support protrusions and the bump structures are substantially equal to or greater than a spacing distance between the bump structures.

4. The semiconductor package of claim 3, wherein each of the first distance and the second distance is in a range of about 10 μm to about 200 μm.

5. The semiconductor package of claim 1, wherein the trench has a sidewall surrounding the second pads.

6. The semiconductor package of claim 5, wherein the sealant fills a space between the sidewall of the trench and the second pads.

7. The semiconductor package of claim 5, wherein the plurality of support protrusions are spaced apart from the sidewall of the trench by a third distance.

8. The semiconductor package of claim 7, wherein the third distance is in a range of about 10 μm to about 200 μm.

9. The semiconductor package of claim 1, wherein the plurality of support protrusions have a cylindrical shape extending perpendicularly from the lower surface of the package substrate.

10. The semiconductor package of claim 1, wherein lower surfaces of the plurality of support protrusions are on substantially a same level as a level of a lower surface of the lower protective layer.

11. The semiconductor package of claim 1,
   wherein the redistribution layer further includes third pads disposed on the upper surface of the package substrate, and wherein the package substrate further includes an upper protective layer having second openings exposing at least a portion of each of the third pads.

12. The semiconductor package of claim 11, further comprising:

second connection bumps disposed in the second openings of the upper protective layer, respectively, and electrically connecting the connection pads of the semiconductor chip to the third pads, respectively.

13. The semiconductor package of claim 11, wherein the trench overlaps the third pads in a direction substantially perpendicular to the lower surface of the package substrate.

14. A semiconductor package, comprising:

a package substrate having upper and lower surfaces opposing each other, and including a redistribution layer, a lower protective layer, and a plurality of support protrusions, wherein the redistribution layer includes pads disposed on the lower surface, wherein the lower protective layer has a trench exposing the pads, and wherein the plurality of support protrusions are disposed in the trench;

a semiconductor chip disposed on the upper surface of the package substrate and electrically connected to the redistribution layer;

an encapsulant covering at least a portion of the semiconductor chip;

a passive device disposed in the trench of the lower protective layer and including connection terminals facing the lower surface;

bump structures connecting the connection terminals of the passive device to the pads of the redistribution layer, respectively; and a sealant extending into the trench and at least partially surrounding the plurality of support protrusions and the bump structures, wherein at least one of the plurality of support protrusions overlaps the passive device in a direction substantially perpendicular to the lower surface of the package substrate.

15. The semiconductor package of claim 14, wherein the plurality of support protrusions and the bump structures have a circular shape.

16. The semiconductor package of claim 15, wherein a diameter or a width of the plurality of support protrusions is substantially a same as or smaller than a diameter or a width of the bump structures.

17. The semiconductor package of claim 14, wherein the bump structures include a pillar portion and a solder portion, wherein the pillar portion is in contact with the connection terminals, and the solder portion is disposed between the pillar portion and the pads.

18. The semiconductor package of claim 14, wherein the sealant is in contact with an entirety of a side surface of each of the plurality of support protrusions and the bump structures.

19. A semiconductor package, comprising:

a package substrate having upper and lower surfaces opposing each other and including a redistribution layer, a lower protective layer, and a plurality of support protrusions, wherein the redistribution layer includes pads disposed on the lower surface, wherein the lower protective layer has a trench exposing the pads, and wherein the plurality of support protrusions are disposed in the trench;

a semiconductor chip disposed on the upper surface of the package substrate and electrically connected to the redistribution layer;

a passive device disposed in the trench of the lower protective layer and electrically connected to the pads; and a sealant covering at least a portion of the passive device and disposed in the trench, wherein the plurality of support protrusions include at least one first support protrusion and at least one second support protrusion, wherein the at least one first support protrusion overlaps the passive device in a direction substantially perpendicular to the lower surface of the package substrate, and the at least one second support protrusion does not overlap the passive device.

20. The semiconductor package of claim 19, wherein the trench has an extension area adjacent to one side of the passive device, and wherein the at least one second support protrusion is disposed within the extension area.

* * * * *